US012696665B2

(12) United States Patent
Yuan et al.

(10) Patent No.: US 12,696,665 B2
(45) Date of Patent: **\*Jul. 28, 2026**

(54) DISPLAY PANEL AND MANUFACTURING METHOD THEREOF, AND DISPLAY DEVICE

(71) Applicant: Shanghai Tianma Micro-Electronics Co., Ltd., Shanghai (CN)

(72) Inventors: Yong Yuan, Shanghai (CN); Guofeng Zhang, Wuhan (CN)

(73) Assignee: Shanghai Tianma Micro-Electronics Co., Ltd., Shanghai (CN)

( \* ) Notice: Subject to any disclaimer, the term of this patent is extended or adjusted under 35 U.S.C. 154(b) by 27 days.

This patent is subject to a terminal disclaimer.

(21) Appl. No.: 18/298,364

(22) Filed: Apr. 10, 2023

(65) Prior Publication Data

US 2023/0247855 A1 Aug. 3, 2023

Related U.S. Application Data

(63) Continuation of application No. 16/916,094, filed on Jun. 29, 2020, now Pat. No. 11,659,728.

(30) Foreign Application Priority Data

May 6, 2020 (CN) .......................... 202010373350.8

(51) Int. Cl.
H10K 59/80 (2023.01)
H10K 59/40 (2023.01)
H10K 59/12 (2023.01)

(52) U.S. Cl.
CPC ........... H10K 59/873 (2023.02); H10K 59/40 (2023.02); H10K 59/879 (2023.02); *H10K 59/12* (2023.02); *H10K 59/877* (2023.02)

(58) Field of Classification Search
CPC .... H10K 50/844; H10K 50/84; H10K 50/858; H10K 50/85; H10K 59/873
See application file for complete search history.

(56) References Cited

U.S. PATENT DOCUMENTS

| 11,659,728 | B2 * | 5/2023 | Yuan | ...................... | H10K 59/40 |
| | | | | | 257/40 |
| 2006/0180815 | A1 * | 8/2006 | Sarma | ............... | G02F 1/133305 |
| | | | | | 257/E21.414 |

(Continued)

FOREIGN PATENT DOCUMENTS

| CN | 106784365 A | 5/2017 |
| CN | 107689423 A | 2/2018 |

(Continued)

*Primary Examiner* — Michele Fan
(74) *Attorney, Agent, or Firm* — Kilpatrick Townsend & Stockton LLP

(57) ABSTRACT

Disclosed are a display panel, a manufacturing method thereof and a display device. The display panel includes a substrate; a plurality of organic light emitting elements, which are located on a side of the substrate; a film encapsulation layer, which is located on a side of the plurality of organic light emitting elements facing away from the substrate; wherein the film encapsulation layer covers the plurality of organic light emitting elements, the film encapsulation layer comprises a first inorganic layer, a lens layer and a second cover layer, the lens layer is located between the first inorganic layer and the second cover layer, and the second covering layer is located on a side of the first inorganic layer facing away from the plurality of organic light emitting elements; wherein the lens layer comprises a plurality of lenses, and a material of the second cover layer is an inorganic material.

12 Claims, 12 Drawing Sheets

(56)           References Cited

U.S. PATENT DOCUMENTS

| | | | |
|---|---|---|---|
| 2014/0034919 A1 | 2/2014 | Park et al. | |
| 2015/0169011 A1* | 6/2015 | Bibl | H01L 33/44 |
| | | | 345/175 |
| 2016/0087018 A1* | 3/2016 | Shim | H10K 50/865 |
| | | | 257/40 |
| 2016/0149163 A1* | 5/2016 | Chen | G02B 3/0056 |
| | | | 359/620 |
| 2018/0088726 A1* | 3/2018 | Gwon | G06F 3/041 |
| 2018/0164640 A1* | 6/2018 | Kim | G02F 1/133606 |
| 2019/0371866 A1* | 12/2019 | Kim | H10K 59/879 |

FOREIGN PATENT DOCUMENTS

| | | | |
|---|---|---|---|
| CN | 109036130 A | | 12/2018 |
| CN | 109346618 A | | 2/2019 |
| CN | 209785979 U | * | 12/2019 |

* cited by examiner

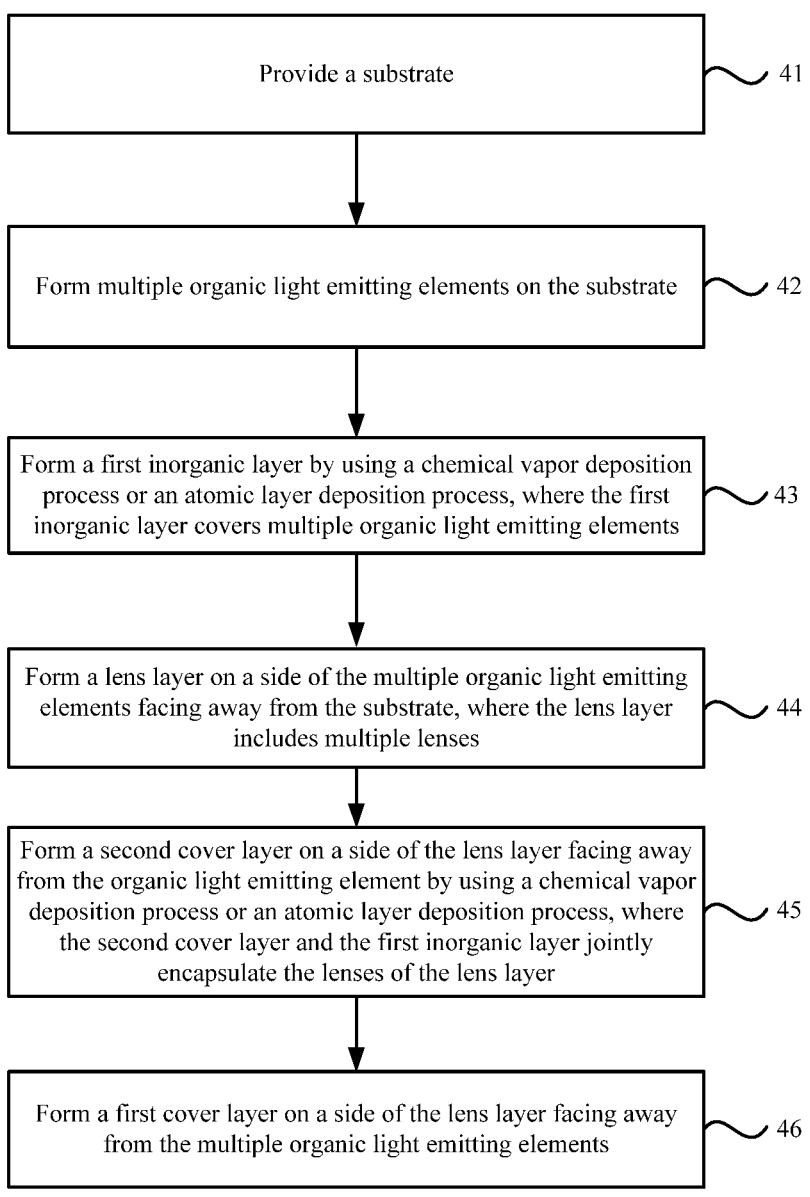

| | |
|---|---|
| Provide a substrate | 41 |
| Form multiple organic light emitting elements on the substrate | 42 |
| Form a first inorganic layer by using a chemical vapor deposition process or an atomic layer deposition process, where the first inorganic layer covers multiple organic light emitting elements | 43 |
| Form a lens layer on a side of the multiple organic light emitting elements facing away from the substrate, where the lens layer includes multiple lenses | 44 |
| Form a second cover layer on a side of the lens layer facing away from the organic light emitting element by using a chemical vapor deposition process or an atomic layer deposition process, where the second cover layer and the first inorganic layer jointly encapsulate the lenses of the lens layer | 45 |
| Form a first cover layer on a side of the lens layer facing away from the multiple organic light emitting elements | 46 |

FIG. 23

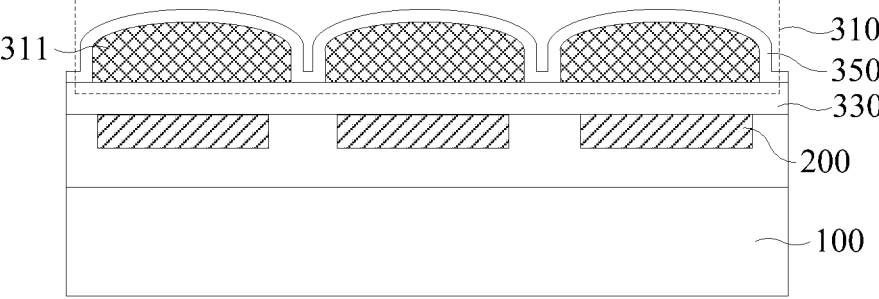

FIG. 24

DISPLAY PANEL AND MANUFACTURING METHOD THEREOF, AND DISPLAY DEVICE

CROSS-REFERENCE TO RELATED APPLICATIONS

This is a continuation application of U.S. patent application Ser. No. 16/916,094, filed on Jun. 29, 2020, which claims priority to Chinese Patent Application No. CN 202010373350.8 filed with CNIPA on May 6, 2020, the disclosures of which are incorporated herein by reference in their entirety.

FIELD

The present disclosure relates to the field of display technologies and, in particular, to a display panel, a manufacturing method thereof and a display device.

BACKGROUND

Organic light emitting display panels have the advantages of self-lighting without backlight, high brightness, and low power consumption, and are widely used in various electronic devices.

At present, the theoretical internal quantum efficiency of an organic light emitting display panel is close to 100%; however, since film layers made of different materials in the organic light emitting display panel have different refractive indexes, light emitted by an organic light emitting element is reflected or totally reflected at an interface between adjacent film layers made of different materials, and the light extraction efficiency of the display panel is not high.

SUMMARY

The present disclosure provides a display panel, a manufacturing method thereof and a display device, to increase the light extraction efficiency of the display panel.

One embodiment of the present disclosure provides a display panel. The display panel includes: a substrate; multiple organic light emitting elements, which are located on one side of the substrate; and a film encapsulation layer, which is located on a side of the multiple organic light emitting elements facing away from the substrate; where the film encapsulation layer covers more than one of the multiple organic light emitting elements, the film encapsulation layer includes a lens layer and a first cover layer, the lens layer is located on a side of the first cover layer facing the organic light emitting elements, materials of the lens layer and the first cover layer are both organic materials, a refractive index of the lens layer is M, a refractive index of the first cover layer is N, N<M, the lens layer includes multiple lenses, and a surface of each of the multiple lenses facing away from the organic light emitting elements is convex towards a side facing away from the multiple organic light emitting elements.

One embodiment of the present disclosure further provides a display device including the display panel described in the above embodiment.

One embodiment of the present disclosure further provides a method of manufacturing a display panel, where the method is used to manufacture the display panel described in the above first embodiments, and the method for manufacturing the display panel includes: providing a substrate; forming multiple organic light emitting elements on the substrate; and forming a film encapsulation layer on a side of the multiple organic light emitting elements facing away from the substrate.

The step of forming the film encapsulation layer includes: forming a lens layer on a side of the multiple organic light emitting elements facing away from the substrate, where the lens layer includes multiple lenses; and forming a first cover layer on a side of the lens layer facing away from the multiple organic light emitting elements.

Materials of the lens layer and the first cover layer are both organic materials, a refractive index of the lens layer is M, a refractive index of the first cover layer is N, N<M, and a surface of each of the multiple lenses facing away from the organic light emitting elements is convex towards a side facing away from the multiple organic light emitting elements.

BRIEF DESCRIPTION OF DRAWINGS

Embodiments of the present disclosure will become more apparent by reading the detailed description with reference to the following drawings.

FIG. 23 is a schematic flowchart of a method of manufacturing another display panel according to an embodiment of the present disclosure;

FIG. 24 is a schematic structure diagram of a second cover layer formed on a lens layer according to an embodiment of the present disclosure;

DETAILED DESCRIPTION

Figure 1:
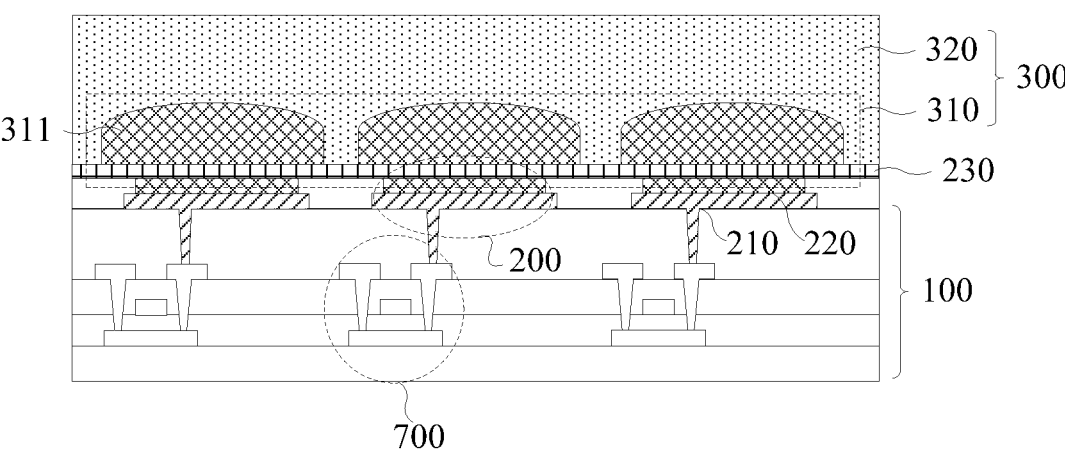
FIG. 1 is a schematic structural diagram of a display panel according to an embodiment of the present disclosure.

Embodiments of a display panel, a manufacturing method thereof and a display device according to the present disclosure are described in detail below with reference to the drawings and embodiments.

One embodiment of the present disclosure provides a display panel. The display panel includes: a substrate; multiple organic light emitting elements, which are located on one side of the substrate; and a film encapsulation layer, which is located on a side of the multiple organic light emitting elements facing away from the substrate; where the film encapsulation layer covers more than one of the multiple organic light emitting elements, the film encapsulation layer includes a lens layer and a first cover layer, the lens layer is located on a side of the first cover layer facing the organic light emitting elements, materials of the lens layer and the first cover layer are both organic materials, a refractive index of the lens layer is M, a refractive index of the first cover layer is N, N<M, the lens layer includes multiple lenses, and a surface of each of the lenses facing away from the organic light emitting elements is convex towards a side facing away from the multiple organic light emitting elements.

According to the present disclosure, the film encapsulation layer includes a lens layer and a first cover layer, the first cover layer is located on a side of the lens layer facing away from the organic light emitting elements, the materials of the lens layer and the first cover layer are both organic materials, the refractive index of the lens layer is less than the refractive index of the first cover layer, the lens layer includes multiple lenses, the surface of each lens facing away from an organic light emitting element is convex toward the side facing away from the organic light emitting element, and the propagation direction of the light emitted by the organic light emitting element is changed under the influence of the lens and the first covering layer, and the amount of the reflected or totally reflected light is reduced, and the light extraction efficiency of the display panel is increased.

Secondly, the present disclosure is described in detail with reference to the schematic diagrams. In the detailed description of the embodiments of the present disclosure, for the convenience of explanation, the schematic diagrams showing the structure of the device are not partially enlarged according to general proportions, and the schematic diagrams are merely examples, which should not limit the scope of protection of the present disclosure. In addition, the actual production should include three-dimensional space dimensions of length, width and height.

In order to increase the light extraction efficiency of the organic light emitting display panel, in the related art, a light path adjusting layer for changing the light propagation direction is located in the organic light emitting display panel to reduce the amount of light reflected and totally reflected in the organic light emitting display panel. The light path adjusting layer is not an inherent structure of the organic light emitting display panel, and is additionally added to the organic light emitting display panel, which may result in an increase in the thickness of the organic light emitting display panel, contrary to the requirement of thinning the existing display panel.

In view of the above, the embodiment of the present disclosure provides a lens layer and a first cover layer for changing the light path in the film encapsulation layer of the display panel. The materials of the lens layer and the first cover layer are both organic materials, and the lens layer and the first cover layer can replace an original organic layer in the film encapsulation layer, and the light extraction efficiency of the display panel is increased without changing the thickness of the display panel.

FIG. 1 is a schematic structural diagram of a display panel according to an embodiment of the present disclosure. As shown in FIG. 1, the display panel includes a substrate 100, multiple organic light emitting elements 200 and a film encapsulation layer 300.

The multiple organic light emitting elements 200 are located on one side of the substrate 100. The film encapsulation layer 300 is located on one side of the organic light emitting element 200 facing away from the substrate 100, the film encapsulation layer 300 covers more than one organic light emitting element 200, the film encapsulation layer 300 includes a lens layer 310 and a first cover layer 320, the lens layer 310 is located on one side of the first cover layer 320 facing the organic light emitting elements 200, materials of the lens layer 310 and the first cover layer 320 are organic materials, a refractive index of the lens layer 310 is M, a refractive index of the first cover layer 320 is N, N<M, the lens layer 310 includes multiple lenses 311, and a surface of the lens 311 facing away from the organic light emitting element 200 is convex toward a side facing away from the organic light emitting element 200.

FIG. 1 only uses an example in which each organic light emitting element 200 corresponds to one lens 311 as an example for description and not limitation. In other implementation manners of the embodiment, each organic light emitting element 200 may correspond to multiple lenses 311.

Exemplarily, materials of the lens layer 310 and the first cover layer 320 may be organic glass.

It should be noted that the lens layer 310 and the first cover layer 320 are used to adjust the propagation direction of the light emitted from the organic light emitting element 200, the amount of light that undergoes total reflection is reduced and the light extraction efficiency of the display panel is improved.

It should also be noted that the conventional film encapsulation layer 300 is a laminated structure of an inorganic layer, an organic layer and an inorganic layer. In the embodiment, the lens layer 310 and the first cover layer 320 are both formed by using an organic material, and can jointly replace one organic layer in the film encapsulation layer 300; the light extraction efficiency of the display panel can be increased by arranging the lens layer 310 and the first cover layer 320 while the thickness of the film encapsulation layer 300 is not changed.

It is noted that when the surface of the lens 311 facing away from the organic light emitting element 200 is convex toward the side facing away from the organic light emitting element 200, the lens layer 320 may be formed by using an inkjet printing technique or a photolithography technique, and the lens layer 320 may be formed by flexibly selecting a more suitable process according to actual needs.

With continued reference to FIG. 1, the organic light emitting element 200 includes a first electrode 210, an organic light emitting function layer 220 and a second electrode 230 which are stacked along the light extraction direction of the organic light emitting element 200, the substrate 100 includes multiple pixel driving circuits, each pixel driving circuit is electrically connected to one first electrode 210 correspondingly, the pixel driving circuit is used for driving the corresponding organic light emitting element 200 to emit light, the conventional pixel driving circuit includes multiple film transistors and at least one capacitor, and the position of the corresponding pixel driving circuit is illustrated by one film transistor 700 in the pixel driving circuit in FIG. 1. To simplify the structure of the drawings, the internal structures of the substrate 100 and the organic light emitting element 200 are not illustrated in detail in the following drawings.

Figure 2:
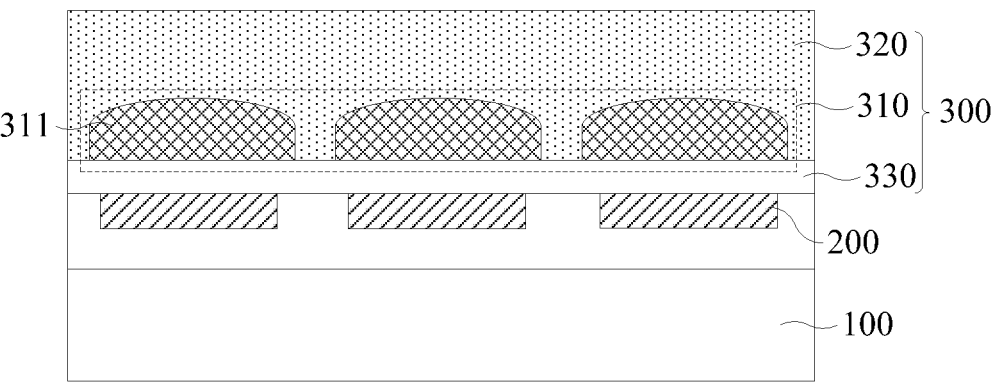
FIG. 2 is a schematic structural diagram of another display panel according to an embodiment of the present disclosure.

FIG. 2 is a schematic structural diagram of another display panel according to an embodiment of the present disclosure. As shown in FIG. 2, on the basis of the structure shown in FIG. 1, the film encapsulation layer 300 further includes a first inorganic layer 330, and the first inorganic layer 330 is located between the organic light emitting element 200 and the lens layer 310.

It should be noted that, due to the characteristics of the material, the water-oxygen blocking ability of the inorganic layer is superior to that of the organic layer. The first inorganic layer 330 provided between the organic light emitting element 200 and the lens layer 310 can enhance the water-oxygen blocking ability of the film encapsulation layer 300, and thus enhance the encapsulation effect of the film encapsulation layer 300.

Exemplarily, the material of the first inorganic layer 330 may be silicon nitride, silicon oxide, silicon oxynitride, or silicon carbide. In an embodiment, the material of the first inorganic layer 330 may also be aluminum oxide. The aluminum oxide formed by an atomic layer deposition process has a strong water-oxygen blocking ability and a small thickness, and can obtain an effective water-oxygen blocking effect with a small thickness. On one hand, when the lens layer 310 on the first inorganic layer 330 is formed by an inkjet printing process, the water vapor in the printing droplets can be blocked from invading into the organic light emitting element, avoiding damage to the organic light emitting element. On the other hand, the first inorganic layer 330 is a film layer located between the organic light emitting element 200 and the lens layer 310, and its smaller thickness can reduce the distance between the lens 311 and the corresponding organic light emitting element 200, and the propagation direction of more light is adjusted by the lens 311, which is beneficial to the increase of the light extraction efficiency of the display panel.

Figure 3:
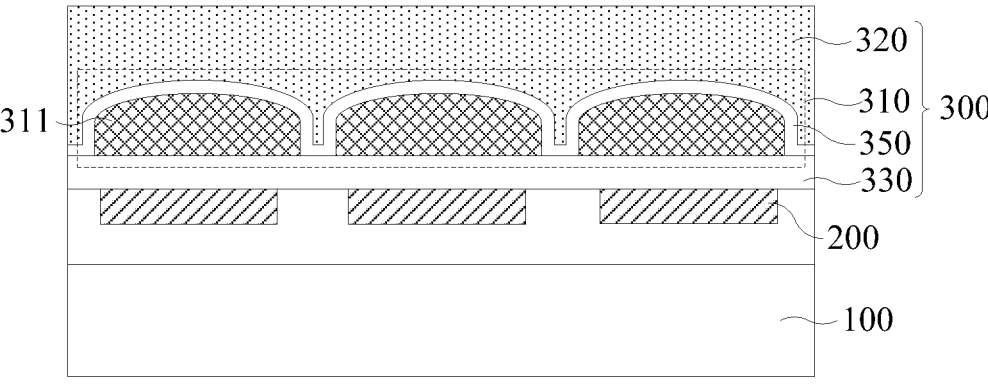
FIG. 3 is a schematic structural diagram of another display panel according to an embodiment of the present disclosure.

Further, FIG. 3 is a schematic structural diagram of another display panel according to an embodiment of the present disclosure. As shown in FIG. 3, on the basis of the structure shown in FIG. 2, the film encapsulation layer 300 further includes a second cover layer 350, the second cover layer 350 is located between the lens layer 310 and the first cover layer 320, and the material of the second cover layer 350 is an inorganic material. The second cover layer 350 includes a first portion overlapping the lens 311 and a second portion not overlapping the lens 311. The second portion of the second cover layer 350 is in contact with the first inorganic layer 330.

It should be noted that the lens 311 is formed of an organic material. Compared with the first inorganic layer 330 and the second cover layer 350 formed of an inorganic material, the water-oxygen blocking ability of the lens 311 is poor. In the embodiment, the second cover layer 350 and the first inorganic layer 330 tightly cover the lenses 311, which improves the water-oxygen blocking ability of the film encapsulation layer 300.

Exemplarily, the material of the second cover layer 350 may be silicon nitride, silicon oxide, silicon oxynitride, or silicon carbide.

In an embodiment, the refractive index of the second cover layer 350 is P, where N<P<M.

It should be noted that the refractive index increases in turn for the lens 311, the second cover layer 350, and the first cover layer 320 which are successively laminated, the light at the interface between any two adjacent film layers has a same deflection directions, the continuity is good, and the light will not be totally reflected from the light sparse material to the light dense material, and the light loss inside the film encapsulation layer 300 is avoided.

Exemplarily, $1.4 \leq P \leq 1.9$, $1.0 \leq N \leq N1.6$, and $1.5 \leq M \leq 2.0$. Solid materials have the refractive index greater than 1.0, a material with a refractive index greater than 1.9 is difficult to manufacture, the refractive index of the lens layer 310 is less than that of the first cover layer 320, and the refractive index ranges of the two do not overlap. Therefore, 1.0 to 1.9 is divided into two intervals, which respectively correspond to the refractive index range of the lens layer 310 and the refractive index range of the first cover layer 320.

Figure 4:
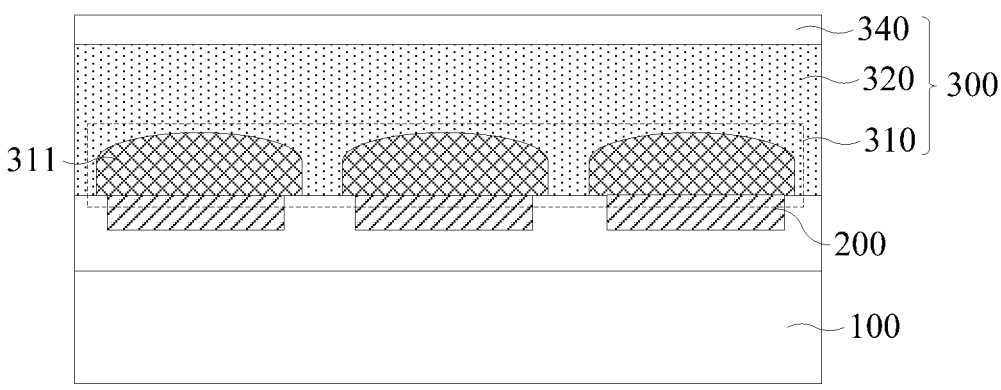
FIG. 4 is a schematic structural diagram of another display panel according to an embodiment of the present disclosure.

FIG. 4 is a schematic structural diagram of another display panel according to an embodiment of the present disclosure. As shown in FIG. 4, based on the structure shown in FIG. 1, the film encapsulation layer 300 further includes a second inorganic layer 340. The second inorganic layer 340 is located on one side of the first cover layer 320 facing away from the organic light emitting element 300.

It should be noted that the film encapsulation layer 300 with the second inorganic layer 340 has better water-oxygen blocking ability and better encapsulation effect for the organic light emitting element 200.

In an embodiment, the material of the second cover layer 350 may be silicon nitride, silicon oxide, silicon oxynitride, or silicon carbide.

Figure 5:
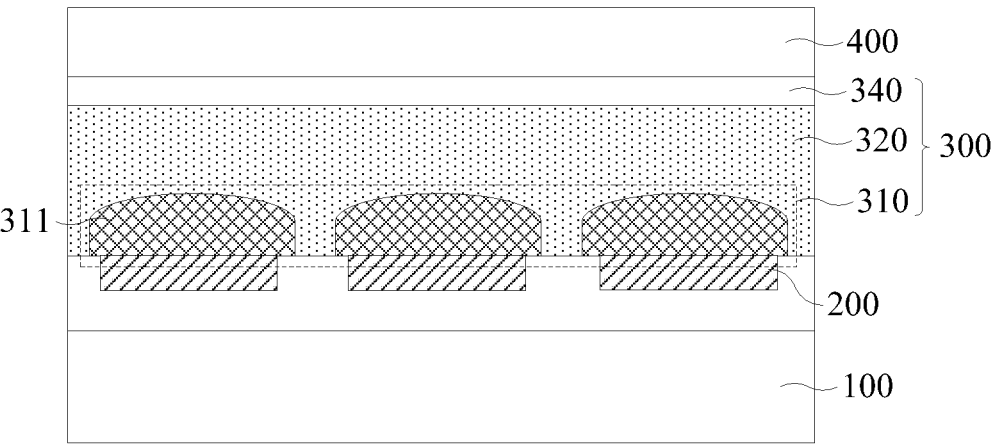
FIG. 5 is a schematic structural diagram of another display panel according to an embodiment of the present disclosure.

FIG. 5 is a schematic structural diagram of another display panel according to an embodiment of the present disclosure. As shown in FIG. 5, based on the structure shown in FIG. 4, the display panel further includes a touch function layer 400. The touch function layer 400 is located on a side of the second inorganic layer 340 facing away from the substrate 100.

It should be noted that the film encapsulation layer 300 is provided with multiple signal lines on a side close to the substrate 100. If a thickness of the film encapsulation layer 300 is too small, the electrical signal on each signal line will interfere with the touch function layer 400, resulting in poor touch performance of the touch function layer 400. It enables to adjust the thickness of the film encapsulation layer 300 by reasonably setting the thickness of the lens layer 310 and the first cover layer 320, to avoid the distance between the touch function layer 400 and each signal line being reduced, and avoid the deterioration of the touch performance of the touch function layer 400.

It should also be noted that the second inorganic layer 340 is formed before the touch function layer 400. When the film deposition process is used to form the touch function layer 400, the second inorganic layer 340 may be used as a substrate of the touch function layer 400.

Figure 6:
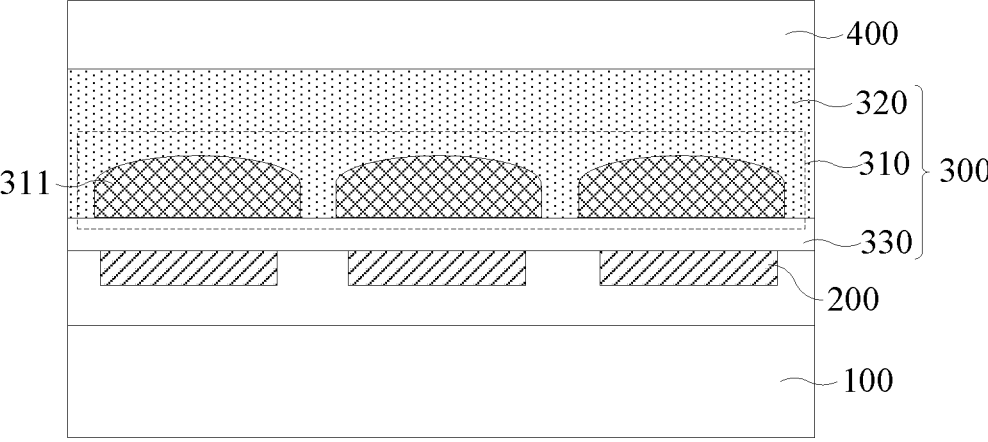
FIG. 6 is a schematic structural diagram of another display panel according to an embodiment of the present disclosure.

FIG. 6 is a schematic structural diagram of another display panel according to an embodiment of the present disclosure. As shown in FIG. 6, based on the structure shown in FIG. 2, the display panel further includes a touch function layer 400. The touch function layer 400 is located on a side of the first cover layer 320 facing away from the substrate, and is in contact with the first cover layer 320.

It should be noted that the touch function layer 400 is formed of an inorganic material, which has a certain water-oxygen blocking effect, and can block invasion of the water vapor on a side facing away from the film encapsulation layer 300. At this time, the film encapsulation layer 300 no longer needs to be provided with an inorganic layer on the first cover layer 310, which is conducive to simplifying the manufacturing process of the display panel.

Figure 7:
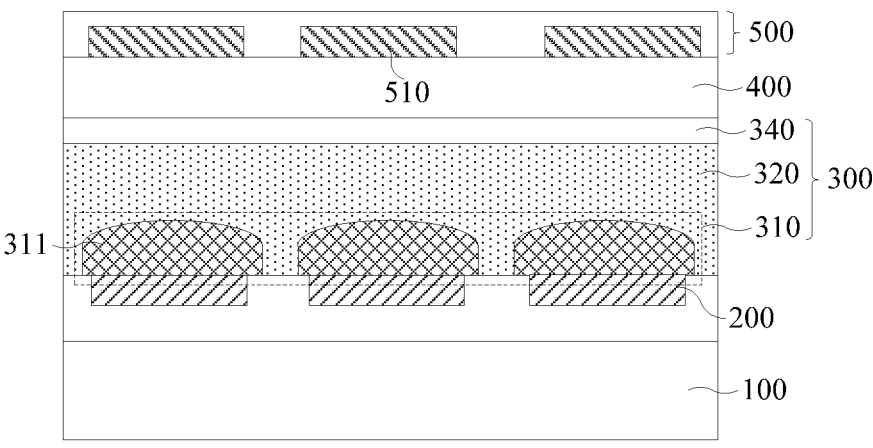
FIG. 7 is a schematic structural diagram of another display panel according to an embodiment of the present disclosure.
Figure 8:
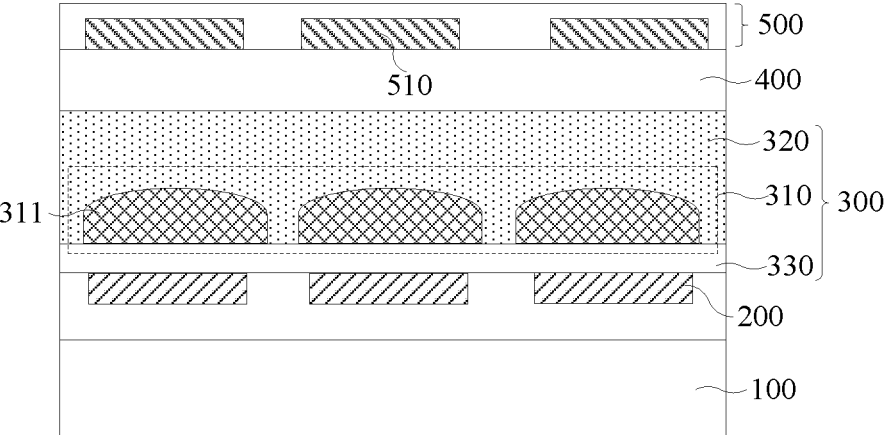
FIG. 8 is a schematic structural diagram of another display panel according to an embodiment of the present disclosure.

FIG. 7 is a schematic structural diagram of another display panel according to an embodiment of the present disclosure. FIG. 8 is a schematic structural diagram of another display panel according to an embodiment of the present disclosure. Based on the structures shown in FIGS. 5 and 6, as shown in FIGS. 7 and 8, the display panel further includes a color resistance layer 500. The color resistance layer 500 is located on a side of the touch function layer 400 facing away from the substrate 100 and includes multiple color resistances 510.

Exemplarily, the light extraction side of each organic light emitting element 200 is correspondingly provided with a color resistance 510, and the color of the color resistance 510 may be red, green, or blue. It may be understood that if a thickness of a film layer between the color resistance layer 500 and the organic light emitting element 200 is too large, light interference between adjacent organic light emitting elements 200 may occur. In the embodiment, the film encapsulation layer 300 is located between the color resistance layer 500 and the organic light emitting element 200, and the thickness of the film encapsulation layer 300 may be adjusted by reasonably setting the thickness of the lens layer 310 and the first cover layer 320, and the thickness of the film between the color resistance layer 500 and the organic light emitting element 200 is adjusted to avoid light crosstalk.

It should be noted that, in order to ensure that the touch function layer 400 has a better touch performance, the thickness of the film encapsulation layer 300 needs to be increased, but in order to avoid light interference, the thickness of the film encapsulation layer needs to be decreased, and the optimal setting scheme in comprehensive consideration of the above two factors is: the lens layer 310 and the first cover layer 320 are added to the display panel without changing the thickness of the film encapsulation layer 300, to improve the light extraction efficiency of the display panel. It enables to achieve the above mentioned effects, and can take into account both the touch performance of the touch function layer 400 and the display effect of the display panel.

Figure 9:
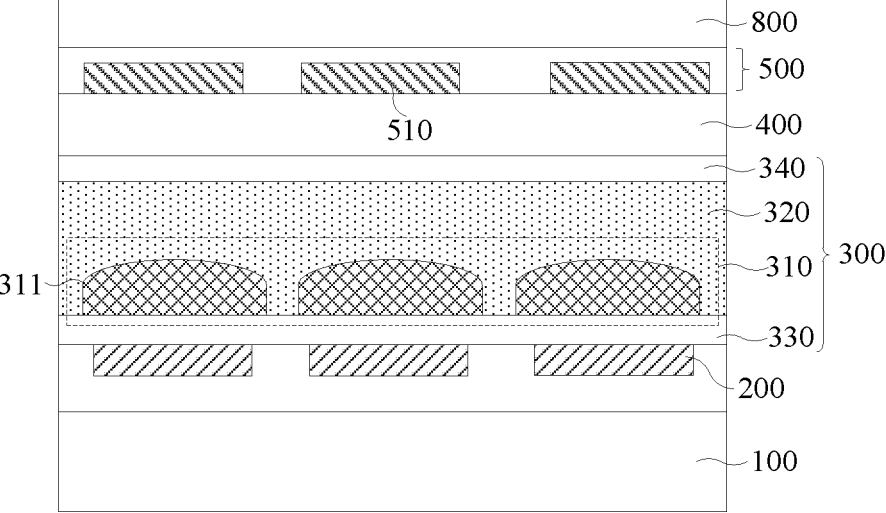
FIG. 9 is a schematic structural diagram of another display panel according to an embodiment of the present disclosure.

In the embodiment, the film encapsulation layer 300 may include at least one of the first inorganic layer 310 and the second inorganic layer 340, that is, the film encapsulation layer 300 only include the first inorganic layer 310, only include the second inorganic layer 340, or include both the first inorganic layer 310 and the second inorganic layer 340; and in the structure including the first inorganic layer 310, the second cover layer 350 may be included at the same time. The above FIGS. 1 to 8 only illustrate some of the structures, and other structures that are not illustrated are also within the scope of the present application, for example, FIG. 9 is a schematic structural diagram of another display panel provided by an embodiment of the present disclosure, and the film encapsulation layer 300 includes both the first inorganic layer 310 and the second inorganic layer 320. Further, with reference to FIG. 9, the display panel may further include a cover plate 800, and the cover plate 800 is located on a side of the color resistance layer 500 facing away from the touch function layer 400.

Figure 10:
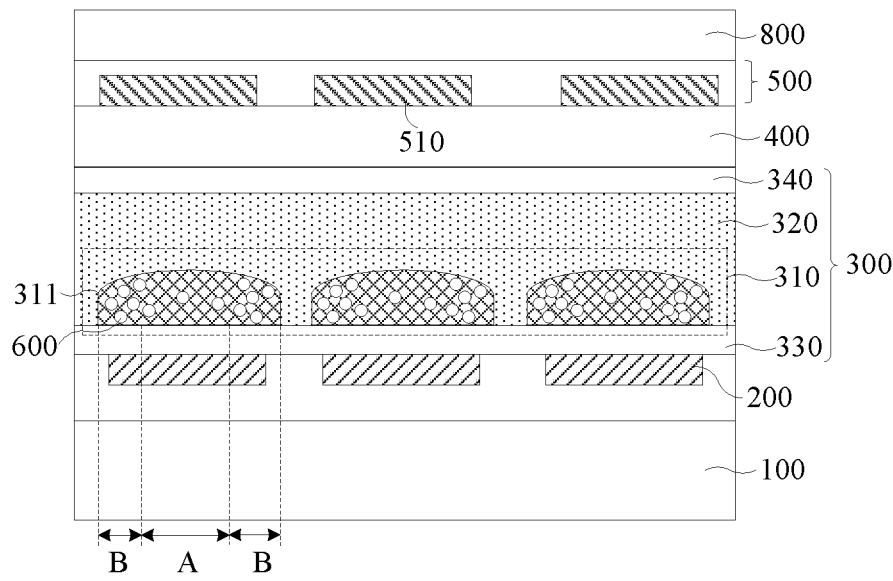
FIG. 10 is a schematic structural diagram of another display panel according to an embodiment of the present disclosure.

FIG. 10 is a schematic structural diagram of another display panel according to an embodiment of the present disclosure. As shown in FIG. 10, the film encapsulation layer 300 further includes scattering particles 600, and the scattering particles 600 are located inside the lens 311.

Figure 11:
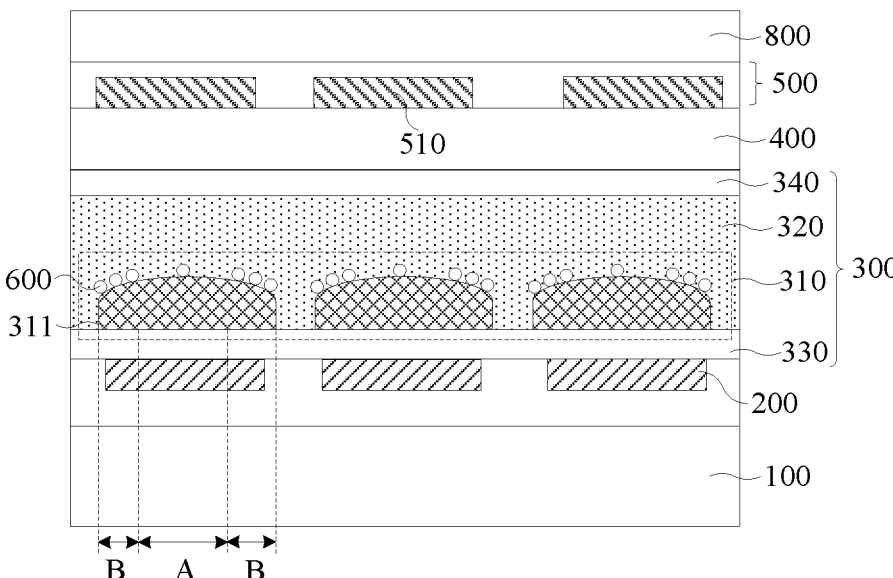
FIG. 11 is a schematic structural diagram of another display panel according to an embodiment of the present disclosure.

FIG. 11 is a schematic structural diagram of another display panel according to an embodiment of the present disclosure. As shown in FIG. 11, the film encapsulation layer 300 further includes scattering particles 600, and the scattering particles 600 are located on a surface of the lens 311 on a side facing away from the substrate 100.

Figure 12:
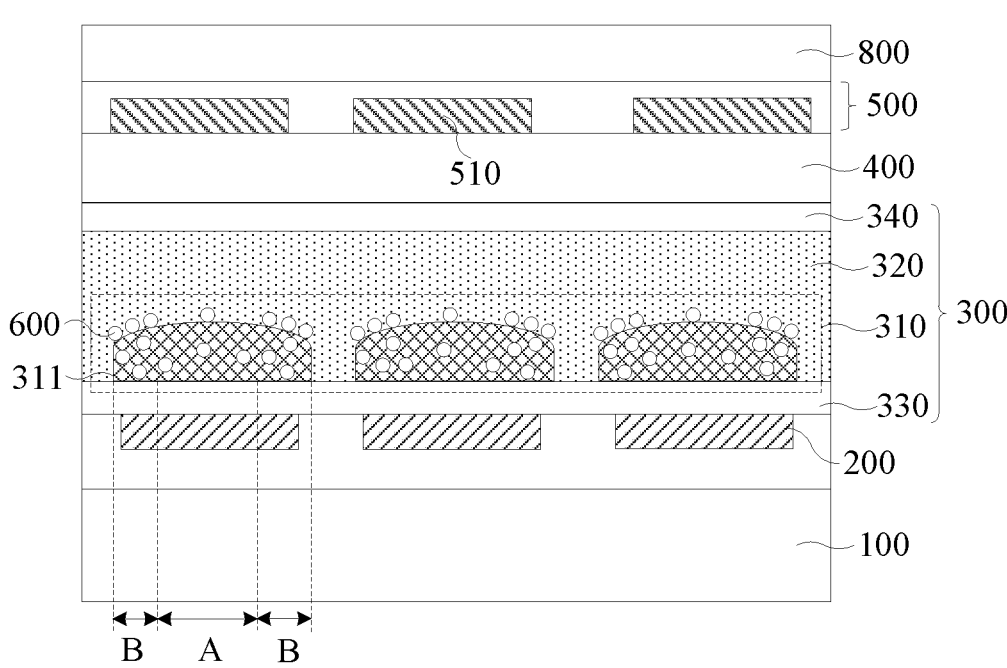
FIG. 12 is a schematic structural diagram of another display panel according to an embodiment of the present disclosure.

FIG. 12 is a schematic structural diagram of another display panel according to an embodiment of the present disclosure. As shown in FIG. 12, the film encapsulation layer 300 further includes scattering particles 600, some of the scattering particles 600 are located inside the lens 311, and the remaining scattering particles 600 are located on a surface of the lens 311 on a side facing away from the substrate 100.

It should be noted that the scattering particles 600 are used to further change the propagation direction of the incident light, to reduce the amount of reflected or totally reflected light, and improve the light extraction effect of the display panel. In order to achieve the above purpose, a refractive index of the scattering particle 600 is different from a refractive index of its surrounding structure, exemplarily, the surrounding structure of the scattering particle 600 in FIG. 10 is the lens 311, and the scattering particle 600 has the refractive index different from that of the lens 311; the surrounding structure of the scattering particle 600 in FIG. 11 is the first cover layer 320, and the scattering particle 600 has the refractive index different from that of the first cover layer 320; the surrounding structure of the scattering particle 600 in FIG. 12 includes the lens 311 and the first cover layer 320, and the scattering particle 600 has the refractive index different from that of the lens 311 and the first cover layer 320.

In an embodiment, the material of the scattering particles 600 may be silica nanoparticles or organic glass. Exemplarily, the value range of the diameter of the scattering particles 600 may be greater than or equal to 5 nm and less than or equal to 100 nm. This range is only an example and is not limiting, and an operator may make reasonable settings according to actual needs.

In other implementations of the embodiment, for the film encapsulation layer 300 with the second cover layer, part or all of the scattering particles 600 may be located on a surface of the second cover layer facing the first cover layer 320.

With continued reference to FIGS. 10, 11 and 12, the lens 311 includes a central area A and an edge area B located around the central area A. The concentration of the scattering particles 600 in the central area A is J1, and the concentration of the scattering particles 600 in the edge area B is J2, and J1<J2.

It should be noted that the incident angle of the light emitted by the organic light emitting element 200 in the central region A is close to 0, and total reflection hardly occurs, while the probability of total reflection of the light incident in the edge region B is high, and the amount of light subjected to the total reflection may be effectively reduced by changing the transmission path of the light through the scattering particles 600, and the concentration of the scattering particles 600 in the central region A is set to be lower than that of the scattering particles 600 in the edge region B.

Figure 13:
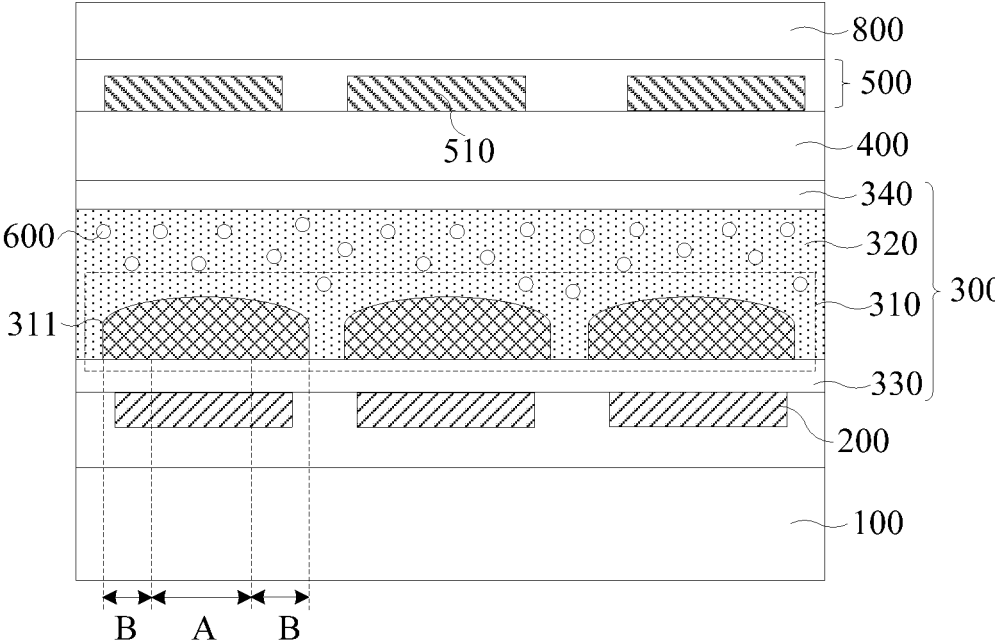
FIG. 13 is a schematic structural diagram of another display panel according to an embodiment of the present disclosure.

FIG. 13 is a schematic structural diagram of another display panel according to an embodiment of the present disclosure. As shown in FIG. 13, the film encapsulation layer 300 further includes scattering particles 600, and the scattering particles 600 are located inside the first cover layer 320.

It should be noted that the scattering particles 600 located in the first cover layer 320 can also change the propagation direction of the incident light and increase the light extraction efficiency of the display panel.

Figure 14:
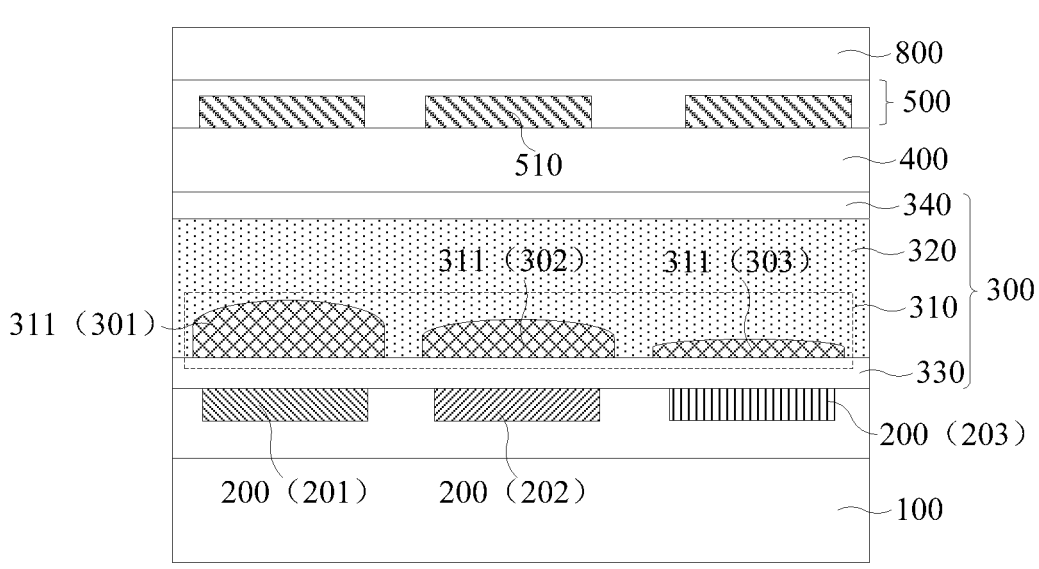
FIG. 14 is a schematic structural diagram of another display panel according to an embodiment of the present disclosure.

FIG. 14 is a schematic structural diagram of another display panel according to an embodiment of the present disclosure. As shown in FIG. 14, multiple organic light emitting elements 200 includes multiple red organic light emitting elements 201, multiple green organic light emitting elements 202, and multiple blue organic light emitting elements 203. The lens 311 corresponding to the red organic light emitting element 201 is a first lens 301, the lens corresponding to the green organic light emitting element 202 is a second lens 302, the lens corresponding to the blue organic light emitting element 203 is a third lens 303, the thickness of the first lens 301 is H1, the thickness of the second lens 302 is H2, the thickness of the third lens 303 is H3, H1>H3, and H2>H3.

It should be noted that the wavelength of blue light is small, and its transmittance is low. In order to make the transmittance of the blue light similar to that of the red light and green light to avoid the color cast, the thickness of the third lens 303 corresponding to the blue organic light emitting element 203 emitting blue light is set smaller than the thickness of the first lens 301 and the second lens 302.

Figure 15:
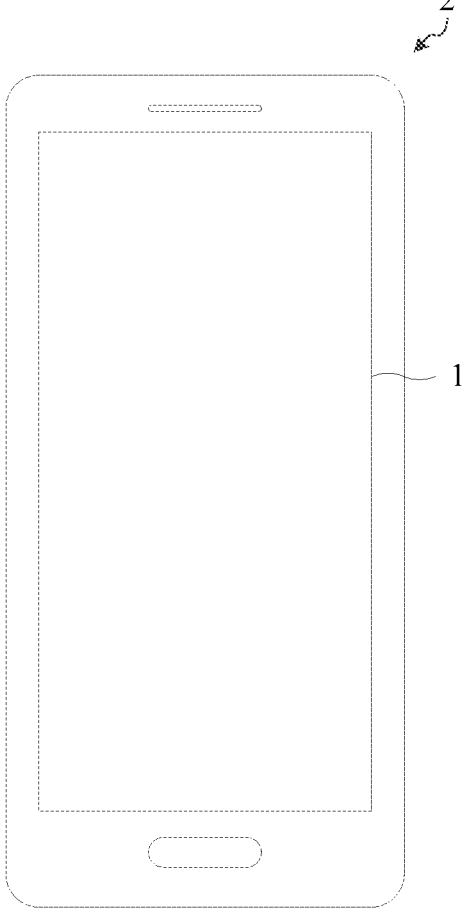
FIG. 15 is a schematic structure diagram of a display device according to an embodiment of the present disclosure.

FIG. 15 is a schematic structure diagram of a display device according to an embodiment of the present disclosure. As shown in FIG. 15, a display device 2 includes a display panel 1 provided by any embodiment of the present disclosure. Since the display device 2 provided in the embodiment includes any display panel 1 provided in the embodiment of the present disclosure, the display device 2 has the same or corresponding beneficial effects as the display panel 1 included in it, which will not be repeated here.

Figure 16:
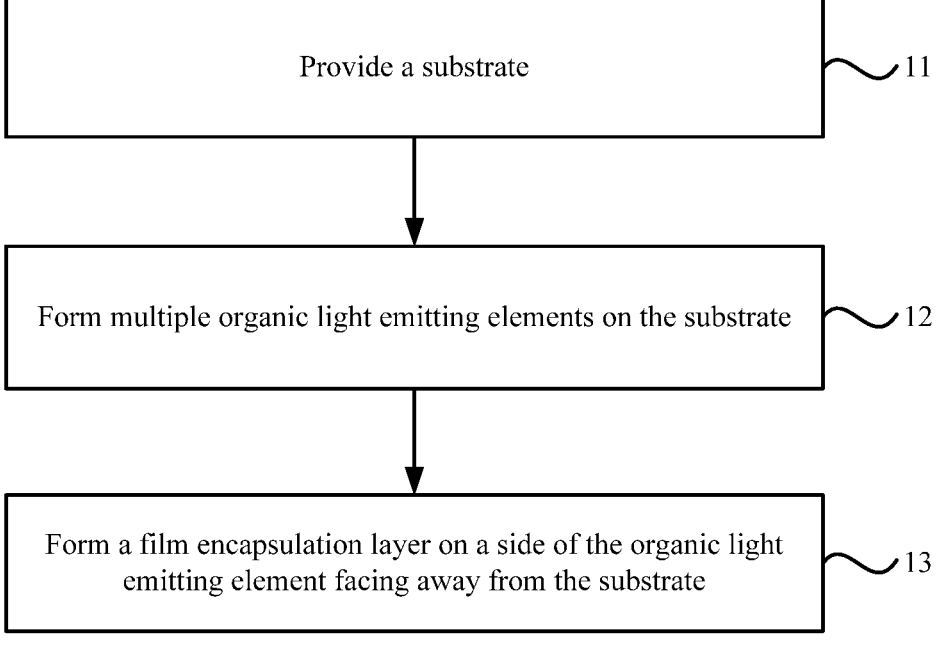
FIG. 16 is a schematic flowchart of a method of manufacturing a display panel according to an embodiment of the present disclosure.

FIG. 16 is a schematic flowchart of a method of manufacturing a display panel according to an embodiment of the present disclosure. The manufacturing method of the display panel is used to manufacture the display panel according to any embodiment of the present disclosure. As shown in FIG. 16, the manufacturing method of the display panel includes the following steps.

In step 11, a substrate is provided.

In step 12, multiple organic light emitting elements are formed on the substrate.

In step 13, a film encapsulation layer is formed on a side of the organic light emitting element facing away from the substrate.

Figure 17:
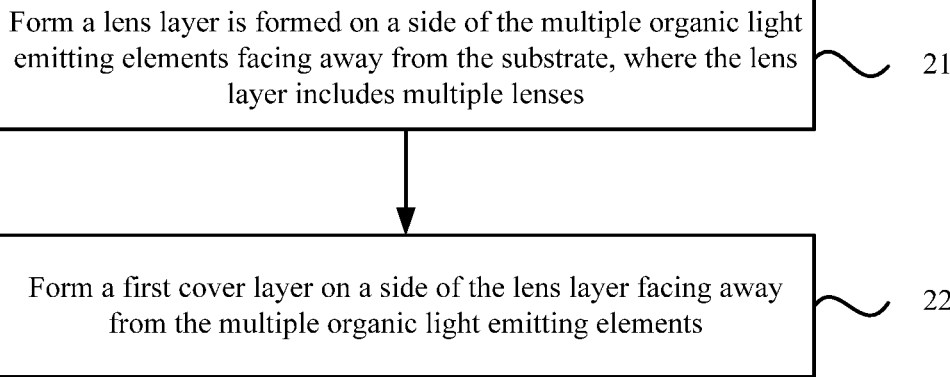
FIG. 17 is a schematic flowchart of a process of forming a film encapsulation layer according to an embodiment of the present disclosure.

In one embodiment, FIG. 17 is a schematic flowchart of a process of forming a film encapsulation layer according to an embodiment of the present disclosure. As shown in FIG. 17, the method of forming the film encapsulation layer includes the following steps.

In step 21, a lens layer is formed on a side of the multiple organic light emitting elements facing away from the substrate, where the lens layer includes multiple lenses.

In step 22, a first cover layer is formed on a side of the lens layer facing away from the multiple organic light emitting elements; where materials of the lens layer and the first cover layer are both organic materials, a refractive index of the lens layer is M, a refractive index of the first cover layer is N, N<M, and a surface of the lens facing away from the organic light emitting elements is convex towards a side facing away from the organic light emitting element.

According to the embodiment, the film encapsulation layer includes a lens layer and a first cover layer, the first cover layer is located on a side of the lens layer facing away from the organic light emitting elements, the materials of the lens layer and the first cover layer are both organic materials, the refractive index of the lens layer is less than the refractive index of the first cover layer, the lens layer includes multiple lenses, the surface of the lens facing away from the organic light emitting element is convex toward the side facing away from the organic light emitting element, and the propagation direction of the light emitted by the organic light emitting element is changed under the influence of the lens and the first cover layer, and the amount of the reflected or totally reflected light is reduced, and the light extraction efficiency of the display panel is increased.

Exemplarily, the step of forming the lens layer may include: forming the lens layer by using an inkjet printing process or a photolithography process.

It should be noted that the formation process of the lens layer in the embodiment is not limited to a single one, and the lens layer may be prepared by using a convenient and fast inkjet printing process or a high-accuracy photolithography process, and the manufacturing process may be selected according to actual needs to improve the applicability of the lens layer in the corresponding scene.

Figure 18:
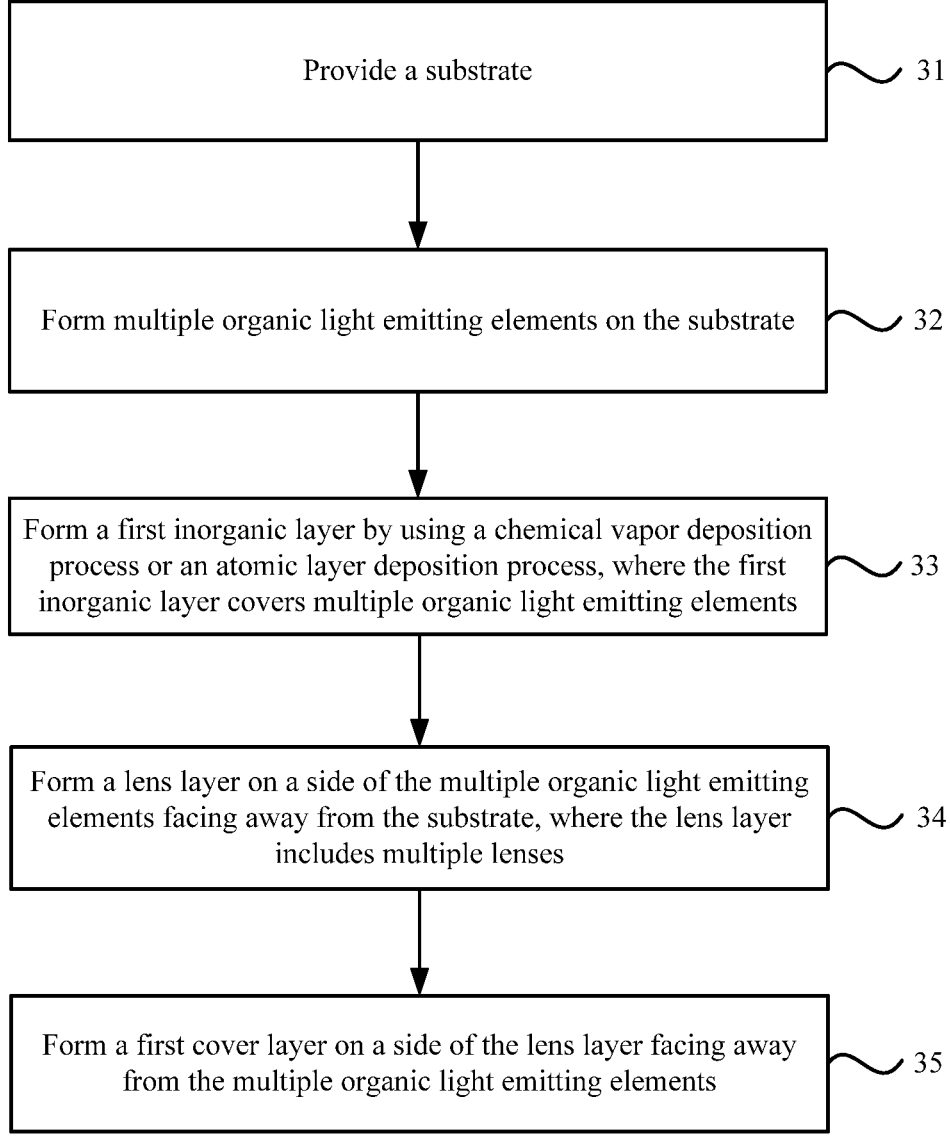
FIG. 18 is a schematic flowchart of a method of manufacturing another display panel according to an embodiment of the present disclosure.

In an embodiment, the step of forming the film encapsulation layer may further include: before forming the lens layer, forming a first inorganic layer by using a chemical vapor deposition process or an atomic layer deposition process, where the first inorganic layer covers multiple organic light emitting elements. In one embodiment, FIG. 18 is a schematic flowchart of a method of manufacturing another display panel according to an embodiment of the present disclosure. As shown in FIG. 18, the manufacturing method of the display panel includes the following steps.

In step 31, a substrate is provided.

Figure 19:
FIGS. 19 to 22 are schematic diagrams of a manufacturing process of a display panel according to an embodiment of the present disclosure.

With reference to FIG. 19, a substrate 100 is provided.

In step 32, multiple organic light emitting elements are formed on the substrate.

Figure 20:
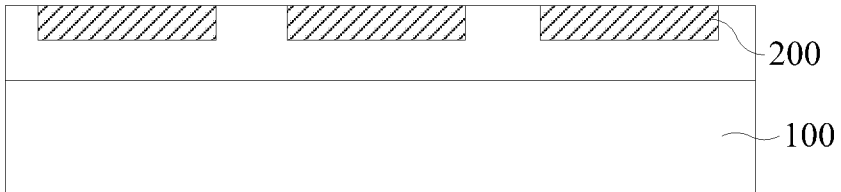

With reference to FIG. 20, multiple organic light emitting elements 200 are formed on the substrate 100.

In step 33, a first inorganic layer is formed by using a chemical vapor deposition process or an atomic layer deposition process, where the first inorganic layer covers multiple organic light emitting elements.

Figure 21:
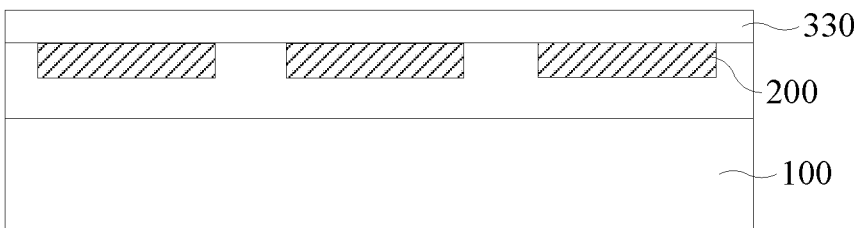

With reference to FIG. 21, a first inorganic layer 330 is formed by using a chemical vapor deposition process or an atomic layer deposition process, where the first inorganic layer 330 covers multiple organic light emitting elements 200.

It should be noted that the atomic layer deposition process may plate the material on the substrate surface layer by layer in the form of a monoatomic film. The thickness of the first inorganic layer formed by the atomic layer deposition process is more uniform and the structure is denser, and the water-oxygen blocking ability is better, which is conducive to the improvement of the encapsulation effect of the film encapsulation layer. In addition, an atomic layer deposition process may be used to form a first inorganic layer with a small thickness but good density, and the distance between the organic light emitting element and the corresponding lens is reduced, and the light extraction efficiency of the display panel is further increased.

On the other hand, the speed of manufacturing the first inorganic layer by the chemical vapor deposition process is fast, and the formed first inorganic layer has good water-oxygen blocking ability.

In step 34, a lens layer is formed on a side of the multiple organic light emitting elements facing away from the substrate, where the lens layer includes multiple lenses.

Figure 22:
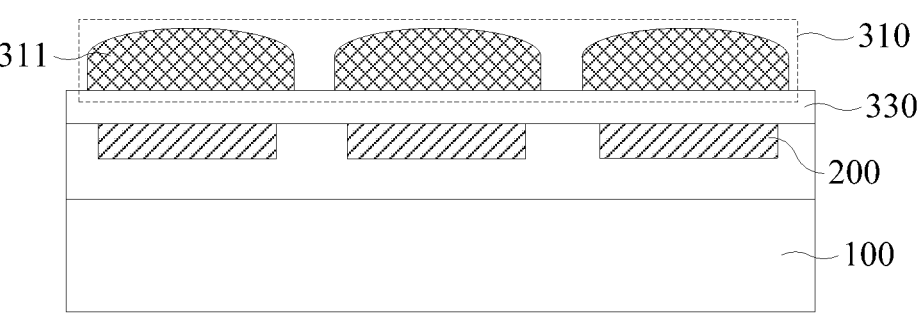

With reference to FIG. 22, a lens layer 310 is formed on a side of the multiple organic light emitting elements 200 facing away from the substrate, where the lens layer 310 includes multiple lenses 311.

In step 35, a first cover layer is formed on a side of the lens layer facing away from the multiple organic light emitting elements.

In one embodiment, FIG. 2 is referred.

In an embodiment, after forming the lens layer and before forming the first cover layer, the method may further include: forming a second cover layer on a side of the lens layer facing away from the organic light emitting element by using a chemical vapor deposition process or an atomic layer deposition process. The second cover layer and the first inorganic layer jointly encapsulate the lens of the lens layer, where the material of the second cover layer is an inorganic material. In one embodiment, FIG. 23 is a schematic flowchart of a method of manufacturing another display panel according to an embodiment of the present disclosure. As shown in FIG. 23, the manufacturing method of the display panel includes the following steps.

In step 41, a substrate is provided.

In one embodiment, FIG. 19 is referred.

In step 42, multiple organic light emitting elements are formed on the substrate.

In one embodiment, FIG. 20 is referred.

In step 43, a first inorganic layer is formed by using a chemical vapor deposition process or an atomic layer deposition process, where the first inorganic layer covers multiple organic light emitting elements.

FIG. 21 is referred.

In step 44, a lens layer is formed on a side of the multiple organic light emitting elements facing away from the substrate, where the lens layer includes multiple lenses.

In one embodiment, FIG. 22 is referred.

In step 45, on a side of the lens layer facing away from the organic light emitting element, a second cover layer is formed by using a chemical vapor deposition process or an atomic layer deposition process, and the second cover layer and the first inorganic layer jointly encapsulate the lenses of the lens layer.

With reference to FIG. 24, on a side of the lens layer 310 facing away from the organic light emitting element 200, a second cover layer 350 is formed by using a chemical vapor deposition process or an atomic layer deposition process, and the second cover layer 350 and the first inorganic layer 330 jointly encapsulate the lens 311 of the lens layer 310.

It should be noted that the atomic layer deposition process may be used to form a second cover layer with a small thickness and good water-oxygen blocking ability, which is beneficial to further improvement of the encapsulation effect of the film encapsulation layer.

In addition, the chemical vapor deposition process provides another manufacturing process of the second cover layer, which has a fast manufacturing speed, and the formed second cover layer has a good water-oxygen blocking ability.

In step 46, a first cover layer is formed on a side of the lens layer facing away from the multiple organic light emitting elements.

FIG. 3 is referred.

Figure 25:
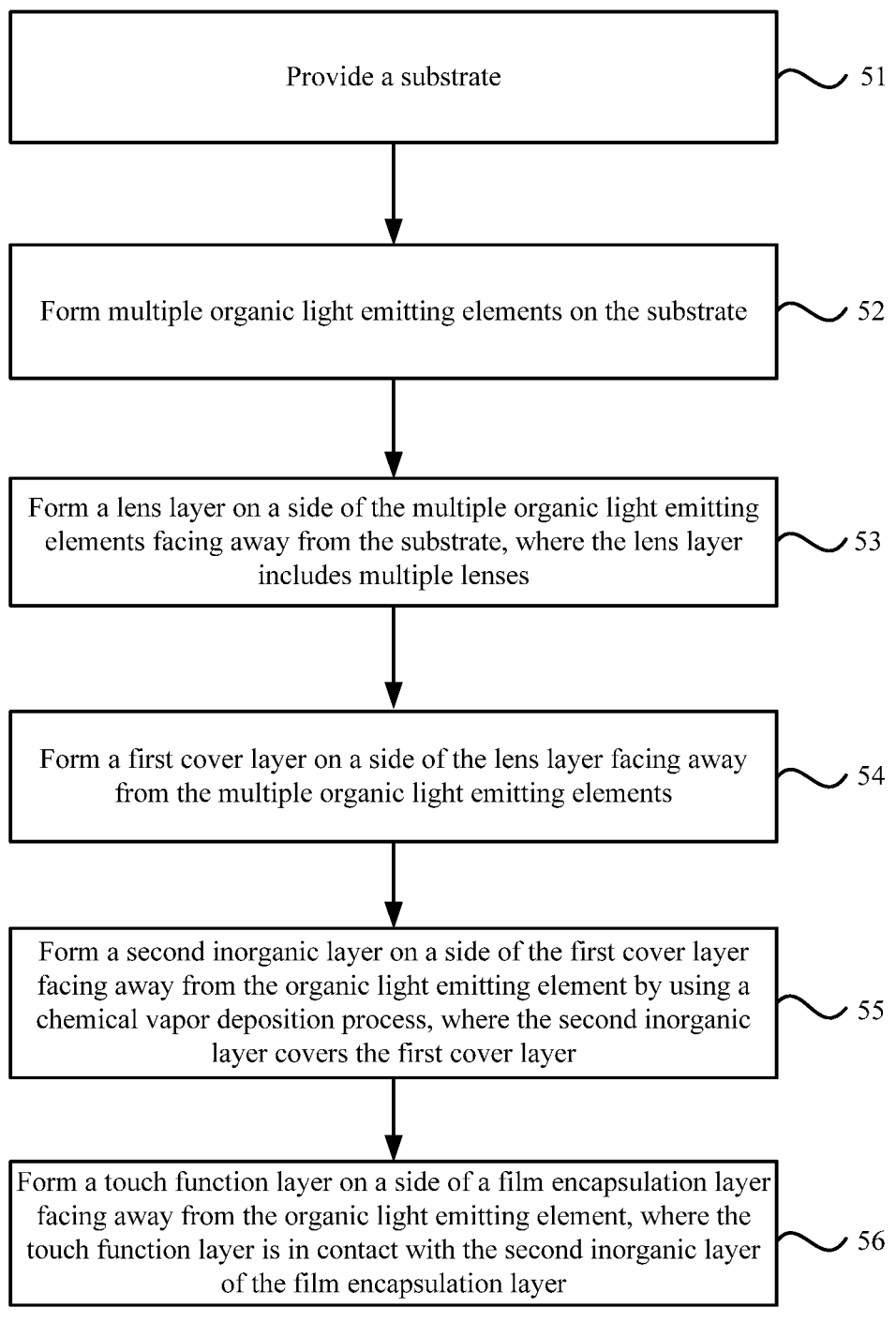
FIG. 25 is a schematic flowchart of a method of manufacturing another display panel according to an embodiment of the present disclosure.

In an embodiment, the step of forming the film encapsulation layer may further include: after forming the first cover layer, using a chemical vapor deposition process to form a second inorganic layer on a side of the first cover layer facing away from the organic light emitting element, where the second inorganic layer covers the first cover layer. After forming the film encapsulation layer, the step may further include: forming a touch function layer on a side of the film encapsulation layer facing away from the organic light emitting element, where the touch function layer is in contact with the second inorganic layer of the film encapsulation layer. In one embodiment, FIG. 25 is a schematic flowchart of a method of manufacturing another display panel according to an embodiment of the present disclosure. As shown in FIG. 25, the manufacturing method of the display panel includes the following steps.

In step 51, a substrate is provided.

FIG. 19 is referred.

In step 52, multiple organic light emitting elements are formed on the substrate.

FIG. 20 is referred.

In step 53, a lens layer is formed on a side of the multiple organic light emitting elements facing away from the substrate, where the lens layer includes multiple lenses.

Figure 26:
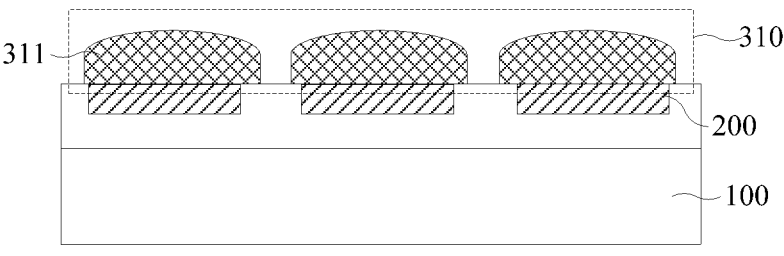
FIGS. 26 to 29 are schematic diagrams of a manufacturing process of a display panel according to an embodiment of the present disclosure.

With reference to FIG. 26, a lens layer 310 is formed on a side of the multiple organic light emitting elements 200 facing away from the substrate 100, where the lens layer 310 includes multiple lenses 311.

In step 54, a first cover layer is formed on a side of the lens layer facing away from the multiple organic light emitting elements.

Figure 27:
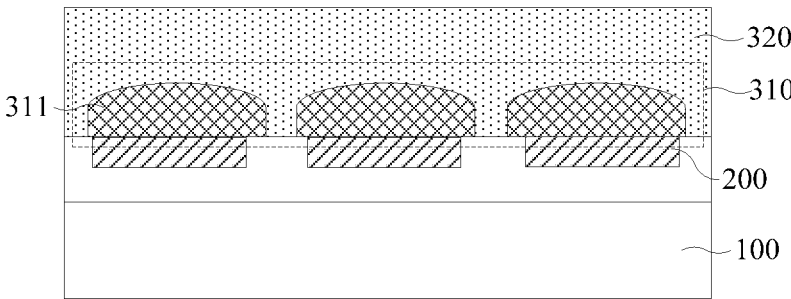

With reference to FIG. 27, a first cover layer 320 is formed on a side of the lens layer 310 facing away from the multiple organic light emitting elements 200.

In step 55, a second inorganic layer is formed on a side of the first cover layer facing away from the organic light emitting element by using a chemical vapor deposition process, where the second inorganic layer covers the first cover layer.

Figure 28:
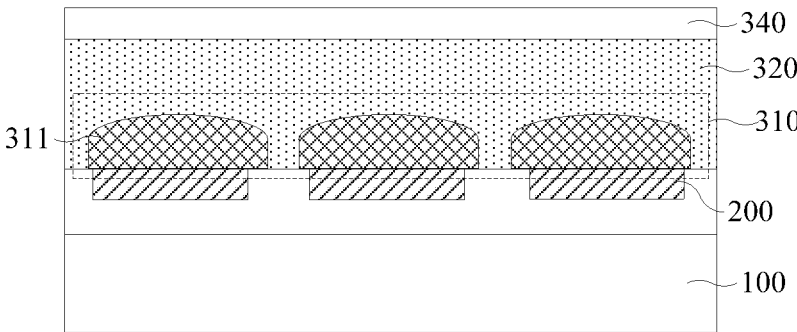

With reference to FIG. 28, a second inorganic layer 340 is formed on a side of the first cover layer 320 facing away from the organic light emitting element 200 by using a chemical vapor deposition process, where the second inorganic layer 340 covers the first cover layer 320.

In step 56, a touch function layer is formed on a side of the film encapsulation layer facing away from the organic light emitting element, where the touch function layer is in contact with the second inorganic layer of the film encapsulation layer.

Figure 29:
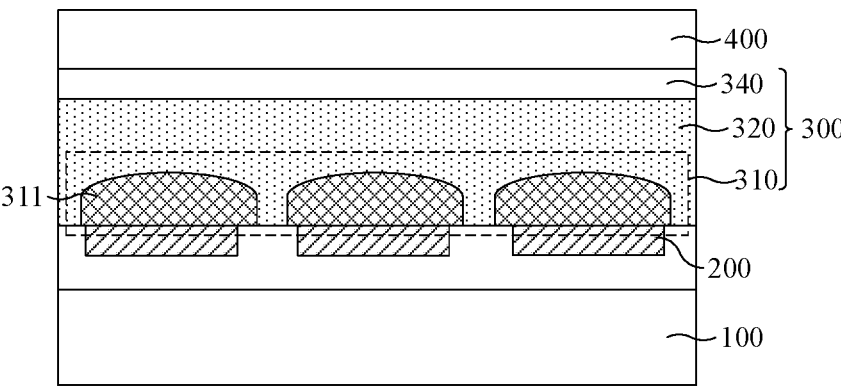

With reference to FIG. 29, a touch function layer 400 is formed on a side of the film encapsulation layer 300 facing away from the organic light emitting elements 200, where the touch function layer 400 is in contact with the second inorganic layer 340 of the film encapsulation layer 300.

It should be noted that the embodiment only illustrates a method of manufacturing a display panel with a partial structure. All methods of manufacturing display panels with all structures provided in this application are within the scope of protection of the embodiment. According to the structure of the display panel, on the basis of the method for manufacturing the display panel shown in FIG. 16, the manufacturing steps of the corresponding structure may be added at the corresponding timing positions, which will not be repeated here.

Exemplarily, the lens layer is formed by using an inkjet printing process in which the droplets used for printing contain scattering particles and the inside of the formed lens contains scattering particles, and/or, after forming the lens layer, scattering particles are formed on the surface of the lens layer facing away from the substrate.

In one embodiment, a lens containing scattering particles may be formed in the following manner: dispersing the scattering particles in the liquid printing material to form droplets containing the scattering particles; in the inkjet printing process, dropping a predetermined amount of droplets at a preset position, which solidify and form the lens, where the lens formed at this time contains scattering particles. Further, droplets with two different scattering particle concentrations may be formed, and droplets with low concentration may be dropped at a position corresponding to the center area of the lens, and droplets with high concentration may be dropped at a position corresponding to the edge area of the lens, and forming the lens with different concentrations of scattering particles in the center area and the edge area.

In addition, the scattering particles may be formed on the surface of the lens layer facing away from the substrate in the following manner: configuring the dispersion solution of the scattering particles, where the liquid in the solution may make the scattering particles more uniformly distributed, and easy to remove, coating or spraying the dispersion solution of the scattering particles on the surface of the lens layer facing away from the substrate side, then removing the solution by heating or other means. Further, two kinds of dispersion solutions with different scattering particle concentrations may be formed, and a dispersion solution with low concentration may be coated on the surface of the corresponding lens center area, and a dispersion solution with high concentration may be coated on the surface of the corresponding lens edge area, to adjust the concentration of scattering particles on the surface of the center area and the edge area.

In an embodiment, the first cover layer is formed by an inkjet printing process. In the inkjet printing process, droplets used for printing contain scattering particles, and the inside of the formed first cover layer contains scattering particles.

In one embodiment, the first cover layer containing scattering particles may be formed in the following manner: dispersing the scattering particles in the liquid printing material to form droplets containing the scattering particles, in the inkjet printing process, dropping a predetermined amount of droplets at a preset position, and forming the first cover layer after curing.

In the embodiment, the lens layer is formed by using an inkjet printing process; in the inkjet printing process, droplets used for printing includes a first volume droplet, a second volume droplet, and a third volume droplet; a volume of the first volume droplet and a volume of the second volume droplet are both larger than a volume of the third volume droplet, the first volume droplet is used to form a first lens, the second volume droplet is used to form a second lens, the third volume droplet is used to form a third lens, a thickness of the first lens is H1, a thickness of the second lens is H2, and a thickness of the third lens is H3, where H1>H3, H2>H3. The organic light emitting element includes a red organic light emitting element, a green organic light emitting element, and a blue organic light emitting element; the red organic light emitting element overlaps the first lens, the green organic light emitting element overlaps the second lens, and the blue organic light emitting element overlaps the third lens.

It should be noted that, when the volumes of the droplets used in the inkjet printing are different, the heights of the corresponding obtained lenses are different, and when the volumes of the first volume of droplets and the second volume of droplets are both larger than the volume of the third volume of droplets, the thickness of the blue organic light emitting element formed by the third volume of droplets is smaller than the thickness of the red organic light emitting element and the thickness of the green organic light emitting element.

In one embodiment, the lens layer is formed by using an inkjet printing process; in the inkjet printing process, the volumes of the liquid drops used for printing are the same; and before the lens layer is formed, the method further includes the following steps: the first inorganic layer includes a first surface facing away from the organic light emitting element, and the first surface is subjected to hydrophobization treatment or hydrophilization treatment, the treated first surface includes a first portion, a second portion, and a third portion, and the hydrophobicity of the first portion and the hydrophobicity of the second portion are both greater than the hydrophobicity of the third portion. The lens in contact with the first portion is a first lens, the lens in contact with the second portion is a second lens, and the lens in contact with the third portion is a third lens, a contact angle of the first lens and the first inorganic layer is $\alpha$, a contact angle of the second lens and the first inorganic layer is $\beta$, and a contact angle of the third lens and the first inorganic layer is $\gamma$, where $\alpha > \gamma$, $\beta > \gamma$. The organic light emitting element includes a red organic light emitting element, a green organic light emitting element, and a blue organic light emitting element; the red organic light emitting element overlaps the first lens, the green organic light emitting element overlaps the second lens, and the blue organic light emitting element overlaps the third lens.

It should be noted that the better the hydrophobicity of the first surface, the smaller the contact angle between the droplets for printing and the first surface, the better the droplets for printing can spread out on the first surface, and thus the smaller the thickness. Based on the above principle, before the lens is formed by adopting the inkjet printing process, the surface of the first inorganic layer corresponding to the organic light emitting elements with different light emitting colors is processed, and the hydrophobicity of the surface corresponding to the blue organic light emitting element is greater than that of the surfaces corresponding to the other organic light emitting elements, and the thickness of the lens corresponding to the blue organic light emitting element is reduced. In one embodiment, the surface of the first inorganic layer may be hydrophilized or hydrophobized; and in an embodiment, the surface corresponding to the blue organic light emitting element is hydrophobized, and the surfaces corresponding to the red organic light emitting element and the green organic light emitting element are hydrophilized. Exemplarily, the plasma treatment method may be used for hydrophilization treatment or hydrophobization treatment.

What is claimed is:

1. A display panel, comprising:

a substrate;

a plurality of organic light emitting elements, which are located on a side of the substrate;

a film encapsulation layer, which is located on a side of the plurality of organic light emitting elements facing away from the substrate; wherein the film encapsulation layer covers the plurality of organic light emitting elements, the film encapsulation layer comprises a first inorganic layer, a lens layer and a second cover layer, the lens layer is located between the first inorganic layer and the second cover layer, and the second covering layer is located on a side of the first inorganic layer facing away from the plurality of organic light emitting elements; wherein the lens layer comprises a plurality of lenses, and a material of the second cover layer is an inorganic material; the second cover layer comprises a first portion overlapping the plurality of lenses and a second portion not overlapping the plurality of lenses, the first portion of the second cover layer is in direct contact with the plurality of lenses, and the second portion of the second cover layer is in direct contact with the first inorganic layer, wherein the film encapsulation layer further comprises a first cover layer, wherein the first cover layer is located on a side of the second cover layer facing away from the plurality of organic light emitting elements, and covers an entire upper surface of the second cover layer;

a material of the first cover layer is an organic material; and a refractive index of the lens layer is M, a refractive index of the first cover layer is N, and a refractive index of the second cover layer is P, wherein N<P<M.

2. The display panel of claim 1, wherein a surface of each of the plurality of lenses facing away from the organic light emitting elements is convex towards a side facing away from the plurality of organic light emitting elements.

3. The display panel of claim 1, wherein the plurality of lenses overlaps with the plurality of organic light emitting elements.

4. The display panel of claim 1, wherein the display panel further comprises a touch function layer, which is located on a side of the film encapsulation layer facing away from plurality of organic light emitting elements;

the film encapsulation layer further comprises a second inorganic layer;

the second inorganic layer is located on a side of the first cover layer facing away from the plurality of organic light emitting elements; and the touch function layer is in contact with the second inorganic layer.

5. The display panel of claim 1, wherein the display panel further comprises a touch function layer, which is located on a side of the film encapsulation layer facing away from the plurality of organic light emitting elements; and the touch function layer is in contact with the first cover layer.

6. A method of manufacturing the display panel according to claim 1, comprising:

providing a substrate;

forming a plurality of organic light emitting elements on the substrate located on a side of the substrate; and forming a film encapsulation layer, wherein the film encapsulation layer covers the plurality of organic light emitting elements;

wherein forming the film encapsulation layer comprises:

forming a first inorganic layer, wherein the first inorganic layer covers the plurality of organic light emitting elements, forming a lens layer, wherein the lens layer is in contact with the first inorganic layer, and is located on a side of the first inorganic layer facing away from the plurality of organic light emitting elements, and the lens layer comprises a plurality of lenses; and forming a second cover layer on a side of the lens layer facing away from the plurality of organic light emitting elements, wherein a material of the second cover layer is an inorganic material, the second cover layer comprises a first portion overlapping the plurality of lenses and a second portion not overlapping the plurality of lenses, the first portion of the second cover layer is in direct contact with the plurality of lenses, and the second portion of the second cover layer is in direct contact with the first inorganic layer, and forming a first cover layer on a side of the second cover layer facing away from the plurality of organic light emitting elements, wherein the first cover layer covers an entire upper surface of the second cover layer, and a material of the first cover layer is an organic material; and a refractive index of the lens layer is M, a refractive index of the first cover layer is N, and a refractive index of the second cover layer is P, wherein N<P<M.

7. The method of manufacturing of claim 6, wherein forming the lens layer comprises:

forming the lens layer by using an inkjet printing process or a photolithography process.

8. The method of manufacturing of claim 7, wherein the lens layer is formed by using an inkjet printing process, wherein in the inkjet printing process, each droplet used for printing has a same volume;

wherein before forming the lens layer, the method further comprises:

the first inorganic layer comprises a first surface facing away from the plurality of organic light emitting elements, the first surface is subjected to a hydrophobization or hydrophilization treatment, the first surface after the hydrophobization or hydrophilization treatment comprises a first portion, a second portion and a third portion, and both the first portion and the second portion have higher hydrophobicity than the third portion;

wherein a lens in contact with the first portion is a first lens, a lens in contact with the second portion is a second lens, and a lens in contact with the third portion is a third lens, a contact angle of the first lens and the first inorganic layer is $\alpha$, a contact angle of the second lens and the first inorganic layer is $\beta$, and a contact angle of the third lens and the first inorganic layer is $\gamma$, wherein $\alpha > \gamma$, $\beta > \gamma$;

the plurality of organic light emitting elements comprise a red organic light emitting element, a green organic light emitting element, and a blue organic light emitting element, the red organic light emitting element overlaps the first lens, the green organic light emitting element overlaps the second lens, and the blue organic light emitting element overlaps the third lens.

9. The method of manufacturing of claim 6, wherein forming the first inorganic layer comprises:

forming the first inorganic layer by using a chemical vapor deposition process or an atomic layer deposition process;

forming the second cover layer comprises:

forming the second cover layer by using a chemical vapor deposition process.

10. The method of manufacturing of claim 6, wherein after forming the film encapsulation layer, the method further comprises:

forming a touch function layer, the touch function layer is located on a side of the film encapsulation layer facing away from the plurality of organic light emitting elements, and the touch function layer is in contact with the first cover layer.

11. The method of manufacturing of claim 6, wherein forming the film encapsulation layer further comprises:

forming a second inorganic layer on a side of the first cover layer facing away from the plurality of organic light emitting elements by using a chemical vapor deposition process after forming the first cover layer, wherein the second inorganic layer covers the first cover layer; wherein after forming the film encapsulation layer, the method further comprises:

forming a touch function layer on a side of the film encapsulation layer facing away from the plurality of organic light emitting elements, wherein the touch function layer is in contact with the second inorganic layer of the film encapsulation layer.

12. A display device, comprising the display panel of claim 1.

* * * * *